(12) United States Patent
Chuang et al.

(10) Patent No.: US 10,043,970 B2
(45) Date of Patent: Aug. 7, 2018

(54) DETERMINING A CHARACTERISTIC OF A MONITORED LAYER ON AN INTEGRATED CHIP

(71) Applicant: Taiwan Semiconductor Manufacturing Co., Ltd., Hsin-Chu (TW)

(72) Inventors: Harry-Hak-Lay Chuang, Zhubei (TW); Tien-Wei Chiang, Taipei (TW); Wen-Chun You, Dongshan Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/449,284

(22) Filed: Mar. 3, 2017

(65) Prior Publication Data

US 2018/0175288 A1    Jun. 21, 2018

Related U.S. Application Data

(60) Provisional application No. 62/434,770, filed on Dec. 15, 2016.

(51) Int. Cl.
*H01L 43/12* (2006.01)
*H01L 21/66* (2006.01)
(Continued)

(52) U.S. Cl.
CPC ............ *H01L 43/12* (2013.01); *H01L 22/12* (2013.01); *H01L 22/32* (2013.01); *H01L 27/222* (2013.01); *H01L 43/02* (2013.01); *H01L 43/08* (2013.01)

(58) Field of Classification Search
CPC ..... H01L 22/22; H01L 22/32; H01L 2224/13; H01L 2224/05571; H01L 2224/05573;
(Continued)

(56) References Cited

U.S. PATENT DOCUMENTS

| 7,759,755 | B2 | 7/2010 | Adkisson et al. |
| 2004/0161865 | A1* | 8/2004 | Yu .......................... H01L 22/22 438/14 |

(Continued)

OTHER PUBLICATIONS

Heiman, D. "Photoluminescence Spectroscopy." Physics U600, Adv Lab I—Physics of Waves and Optics—Summer 2004, Northeastern University, Jun. 1, 2004.
(Continued)

*Primary Examiner* — Dung Le
(74) *Attorney, Agent, or Firm* — Eschweiler & Potashnik, LLC

(57) ABSTRACT

The present disclosure relates to a method for determining a characteristic of a monitored layer of an integrated chip structure. In some embodiments, the method may be performed by forming an integrated chip structure over a substrate. The method further includes forming a monitor layer over the integrated chip structure. The monitor layer includes a plurality of monitor pads. The method also includes measuring an electrical property between a set of monitor pads of the plurality of monitor pads. The set of monitor pads are laterally spaced apart by a monitor pad distance. A characteristic of a region of the integrated chip structure underlying the monitor pad distance between the set of monitor pads is determined based on the measured electrical property.

20 Claims, 11 Drawing Sheets

(51) Int. Cl.
*H01L 43/08* (2006.01)
*H01L 43/02* (2006.01)
*H01L 27/22* (2006.01)

(58) Field of Classification Search
CPC ..... H01L 2224/056; H01L 2924/00014; H01L 43/12; H01L 22/12
See application file for complete search history.

(56) References Cited

U.S. PATENT DOCUMENTS

| | | | |
|---|---|---|---|
| 2007/0072409 | A1 | 3/2007 | Ulmer |
| 2011/0001038 | A1 | 1/2011 | Tseng et al. |
| 2011/0089571 | A1 | 4/2011 | Venezia |
| 2011/0240997 | A1 | 10/2011 | Rockenberger et al. |
| 2013/0052760 | A1* | 2/2013 | Cho ................ H01L 22/14 438/15 |
| 2013/0330846 | A1* | 12/2013 | Tang ................ H01L 22/34 438/15 |
| 2014/0177081 | A1 | 6/2014 | Sugishima |
| 2015/0279885 | A1 | 10/2015 | Tu |
| 2015/0287761 | A1 | 10/2015 | Huang |

OTHER PUBLICATIONS

Cressler, et al. "SiGe HBT Technology: A New Contender for Si-Based RF and Microwave Circuit Applications." IEEE Transactions on Microwave Theory and Techniques, vol. 46, No. 5, May 1998.

Zimmermann, H, "Integrated Silicon Optoelectronics." Chapter 1—Basics of Optical Emission and Absorption. 2010, XX, 386 p. 321 illus., 6 illus. in color., Hardcover. ISBN: 978-3-642-01520-5.

Xu, et al. "Electronic Band Structure and Optical Properties of Silicon Nanoporous Pillar Array." Physica E41(2009) 1882-1885, published Aug. 25, 2009.

Li, et al. "Broadband Infrared Photoluminescence in Silicon Nanowires with High Density Stacking Faults." Nanoscale, 2015, 7, 1601.

Wilamowski, et al. "Fundamentals of Industrial Electronics," Chapter 9—Bipolar Junction Transistor. Published Mar. 4, 2011. ISBN 9781439802793.

Sun, et al. "Delay Time Constant Analysis for Ft Optimization in RF Si/SiGe Bipolar Devices." IEEE article. ISBN 0-7803-7749-4, published in 2003.

Tubert, et al. "High Speed Dual Port Pinned-photodiode for Time-Of-Flight Imaging." 2009 International Image Sensor Workshop, Bergen, Norway, Jun. 22-28, 2009.

Watts, Anthony. A Window on Water Vapor and Planetary Temperature. Published on Jun. 18, 2008. Retrieved from https://wattsupwiththat.com/2008/06/18/a-window-on-water-vapor-and-planetary-temperature/ on May 15, 2017.

Kaufmann, et al, "Near Infrared Image Sensor with Integrated Germanium Photodiodes." Journal of Applied Physics Jul. 2011.

Bob, et al. "Fabrication and Subband Gap Optical Properties of Silicon Supersaturated with Chalcogens by Ion Implantation and Pulsed Laser Melting." Journal of Applied Physics 107, 123506 (2010).

Liu, Jia-Ming. "Photonic Devices." Chapter 14—Lecture 12: Photodiode Detectors. Published online Jan. 2010, ISBN # 9780511614255.

Mayonado, et al. "Investigation of the Bragg-Snell Law in Photonic Crystals." 2015 BFY Proceedings. Edited by Eblen-Zayas, Behringer, and Kozminski; Peer-reviewed, doi:10.1119/bfy.2015.pr.015.

Wang, et al. "Light Trapping in Photonic Crystals." Energy Environ. Sci., 2014, 7, 2725-2738.

Gong, et al. "Photonic Crystals: Principals and Applications." Published Dec. 10, 2013. International Standard Book No. 13: 978-981-4364-83-6 (eBook—PDF).

U.S. Appl. No. 16/609,325, filed May 31, 2017.
U.S. Appl. No. 15/597,452, filed May 17, 2017.
Non-Final Office Action dated Apr. 6, 2018 in connection with U.S. Appl. No. 15/609,325.
Non-Final Office Action dated Apr. 13, 2018 in connection with U.S. Appl. No. 15/597,462.

* cited by examiner

DETERMINING A CHARACTERISTIC OF A MONITORED LAYER ON AN INTEGRATED CHIP

REFERENCE TO RELATED APPLICATION

This Application claims priority to U.S. Provisional Application No. 62/434,770 filed on Dec. 15, 2016, the contents of which is hereby incorporated by reference in its entirety.

BACKGROUND

Chemical mechanical planarization (CMP) is a process of smoothing surfaces with a combination of chemical and mechanical forces. The process uses an abrasive and a corrosive chemical slurry, in conjunction with a polishing pad and retaining ring to polish layers of a semiconductor structure. The pad and wafer are pressed together by a dynamic polishing head and held in place by a plastic retaining ring, while the dynamic polishing head is rotated. This removes material and tends to even out any irregular topography, making a layer of the semiconductor structure substantially flat or planar. This may be used to set up the layer of the semiconductor structure for the formation of additional circuit elements.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
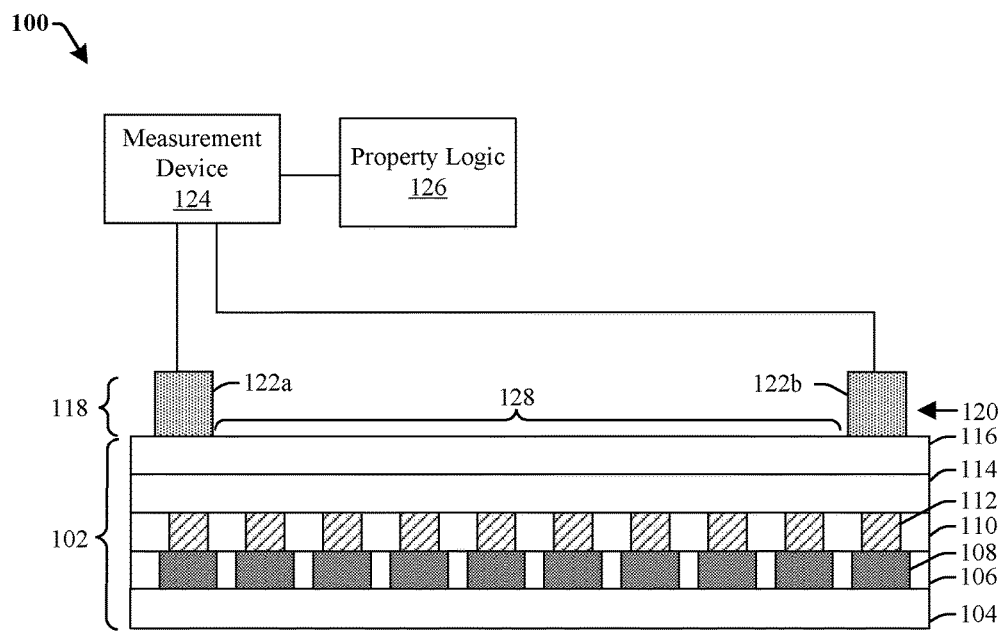
FIG. 1A illustrates a cross-sectional view of some embodiments of a device for determining a characteristic of a monitored layer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The combination of chemical and mechanical forces that chemical mechanical planarization (CMP) exerts on an integrated chip structure may cause damage to the surface and underlying layers of the integrated chip structure. The damage may cause defects that affect the physical and electrical properties of layers in the integrated chip structure that can be difficult to detect. For example, during the formation of a memory device, such as a magnetic random access memory (MRAM) device or resistive random access memory (RRAM) device, a bottom electrode layer can be formed over underlying metal interconnect lines surrounded by a dielectric layer, which is planarized by a CMP process. Because the metal interconnect lines are structurally "weaker" than the dielectric layer, a CMP process can cause "dishing" of the metal interconnect lines. Consequently, these eroded metal interconnect lines can degrade the reliability of the resultant integrated chip structure. For example, the resulting electrical properties of the integrated chip structure may be compromised. Furthermore, the dishing may inadvertently cause the memory elements to be thicker than desired thereby negatively affecting performance of the memory elements.

The present disclosure relates to monitoring the integrity of one or more layers within an integrated chip structure that may have been compromised by a CMP process. In some embodiments, the physical and/or electrical properties of one or more layers may be measured. Furthermore, these measured properties may be used to determine characteristics of the layers. For example, the thickness of a layer can be calculated based on measurements of the electrical properties of the layer.

To monitor the effects to the layers of an integrated chip, a monitor layer is deposited over an integrated chip structure. The monitor layer includes a plurality of monitor pads. A property, such as resistance, is measurable between a set of monitor pads. The measurable property may be used to make determinations regarding the integrity of an underlying layer of the integrated chip structure. For example, it can be determined whether a layer of the integrated chip structure has been compromised by comparing the property to a predetermined threshold. Furthermore, a thickness of a region of a layer of the integrated chip structure underlying the set of monitor pads can be calculated based on the measurable property. Accordingly, the monitor layer allows the effects of the manufacturing process to be monitored.

FIG. 1A illustrates a cross-sectional view of some embodiments of an integrated chip 100 comprising an integrated chip structure 102 for determining a characteristic of a monitored layer. The integrated chip 100 comprises an integrated chip structure 102 and an overlying monitoring structure 118. The integrated chip structure 102 comprises one or more layers arranged over a substrate 104. The monitoring structure 118 is configured to measure a property (e.g., resistance) between different points on the integrated chip structure 102. From the measurable property a characteristic (e.g., thickness) of one or more layers within the integrated chip structure 102 can be determined.

In various embodiments, the integrated chip structure 102 may comprise an arrangement of stacked layers disposed over a semiconductor body. In some embodiments, the integrated chip structure 102 may comprise a conductive material (e.g., copper, aluminum, titanium, tantalum, iron, doped polysilicon, etc.) arranged over a dielectric layer. In some other embodiments, the integrated chip structure 102 may comprise a plurality of layers associated with a memory device (e.g., an MRAM) arranged over the substrate 104.

In some embodiments, wherein the integrated chip structure 102 comprises a plurality of stacked layers associated with a memory device, an inter-layer dielectric (ILD) layer 106 is arranged over the substrate 104. The ILD layer 106 surrounds a plurality of metal layer structures 108. The plurality of metal layer structures 108 may comprise a conductive material such as copper. A dielectric layer 110 is arranged over the ILD layer 106. In some embodiments, the dielectric layer 110 may comprise a dielectric material such as TEOS (Tetraethyl Orthosilicate), for example. The dielectric layer 110 surrounds bottom electrode vias (BEVAs) 112. A bottom electrode layer 114 is arranged over the dielectric layer 110. The BEVAs 112 are in contact with the bottom electrode layer 114. The BEVAs 112 and the bottom electrode layer 114 may also comprise a conductive material. A memory element layer 116 is arranged over the bottom electrode layer 114. In some embodiments, the memory element layer 116 may comprise a magnetic tunnel junction (MTJ) of a magnetoresistive random-access memory (MRAM) cell. In other embodiments, the memory element layer 116 may comprise a resistive switching layer and an upper electrode of a resistive random access memory (RRAM) cell.

The monitoring structure 118 includes a monitor layer 120 arranged over and in contact with the memory element layer 116. The monitor layer 120 includes a plurality of monitor pads 122a/122b. The monitor pads 122a/122b may comprise conductive material, such as, aluminum copper, copper, aluminum, tungsten, some other metal or conductive material, or a combination of the foregoing. The monitor pads 122a/122b are also electrically connected to a measurement device 124. The measurement device 124 is configured to measure a property, such as an electrical property, between the monitor pads 122a/122b. In some embodiments, the measurement device 124 may measure the amount of resistance between the monitor pads 122a/122b.

A property logic 126 uses the property measurement made by the measurement device 124 to determine a characteristic of the integrated chip structure 102. For example, since the resistivity of a material is proportional to a cross-sectional area of a material (i.e., a thickness multiplied by a width), the property logic 126 may use a measured resistance to determine a thickness of one or more layers within the integrated chip structure 102. In some embodiments, the property logic 126 may be configured to determine if the integrated chip structure 102 has any defects (e.g., dishing) by comparing the measurable property and/or determined characteristic to a threshold value.

In one embodiment, the monitor pads 122a/122b may be separated by a monitor pad distance 128. The property logic 126 may use a measurable property from the measurement device 124 to calculate a characteristic of a region of the memory element layer 116 underlying the monitor pad distance 128. Accordingly, specific regions of the integrated chip structure 102 underlying the monitor pad distance 128 can be monitored.

Figure 1B:
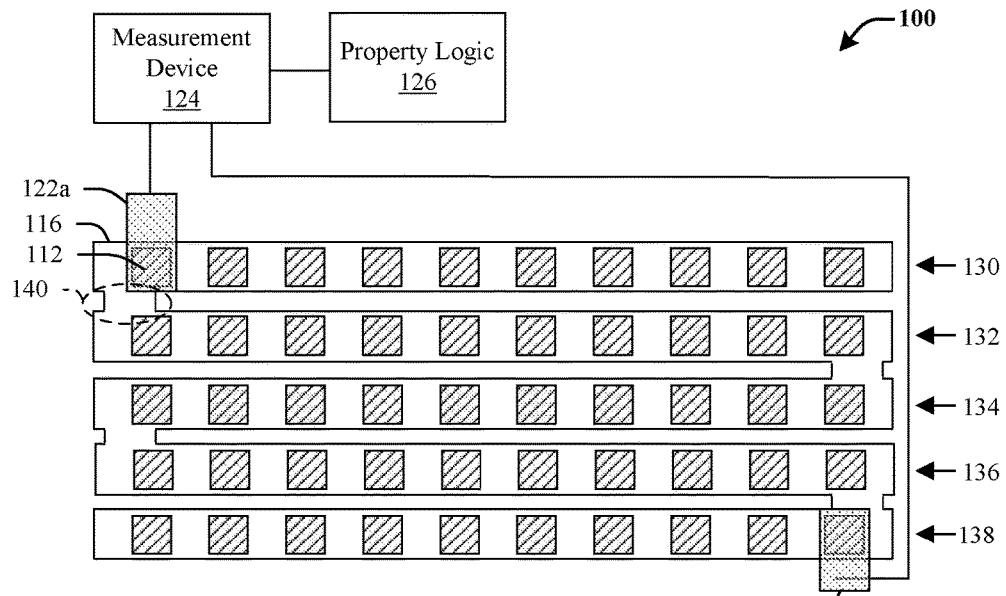
FIG. 1B illustrates a top view of a device for determining a characteristic of a monitored layer corresponding to the embodiment shown in FIG. 1A.

FIG. 1B illustrates a top view of the integrated chip 100 comprising a device for determining a characteristic of a monitored layer corresponding to the embodiment shown in FIG. 1A. Here, the BEVAs 112 are shown relative to their position to the memory element layer 116 and the bottom electrode layer 114, which is not shown. Accordingly, as shown, a monitor pad, like monitor pad 122a, can be placed to overlie a BEVA 112.

The memory element layer 116 may include a plurality of memory lines 130, 132, 134, 136, and 138. A memory line may extend between a first outermost monitor layer sidewall and a second outermost monitor layer sidewall. The distance between the first outermost monitor layer sidewall and the second outermost monitor sidewall may be approximately about 4 to 10 micrometers. The memory lines 130, 132, 134, 136, and 138 are connected at connection points. For example, memory line 130 and memory line 132 are connected at a connection point 140 that physically and electrically connects memory line 130 and memory line 132. Because the memory lines 130, 132, 134, 136, and 138 are electrically connected, the monitor pads 122a/122b can be disposed on different memory lines. For example, monitor pad 122a is disposed on memory line 130 and monitor pad 122b is disposed on memory line 138. The measurement device 124 measures at least one property between the monitor pads 122a/122b so the measured property may be indicative of a characteristic of the semiconductor device across the memory lines 130, 132, 134, 136, and 138. Accordingly, the monitor pads 122a/122b can be placed in the monitoring layer 120 in order to test specific memory lines.

Figure 2A:
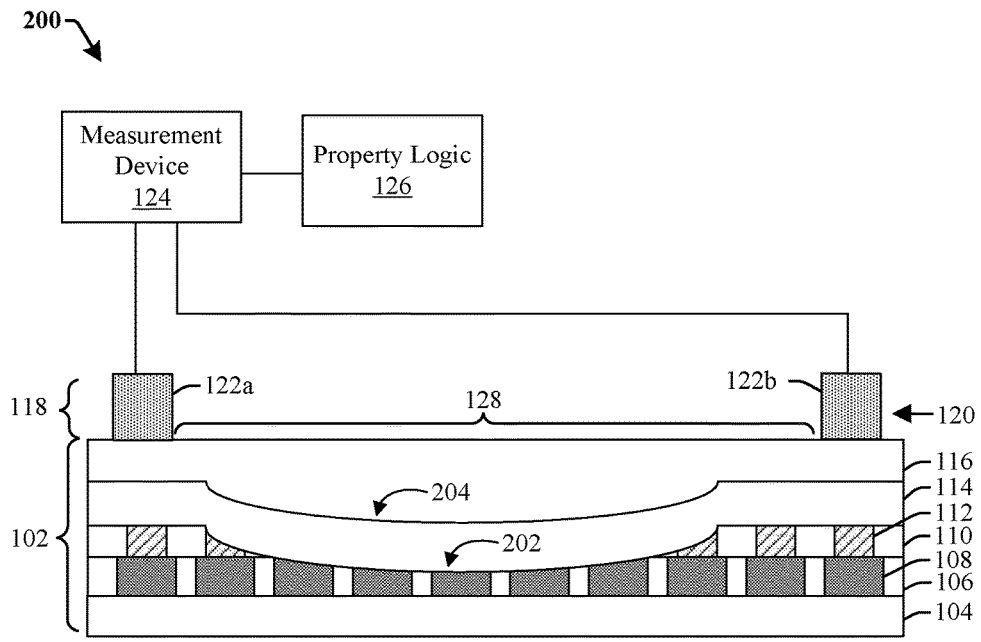
FIG. 2A illustrates a cross-sectional view of some other embodiments of a device for determining a characteristic of an integrated chip structure.

FIG. 2A illustrates a cross-sectional view of some other embodiments of an integrated chip 200 having a device for determining a characteristic of an integrated chip structure. The integrated chip structure 102, the monitor structure 118, the measurement device 124, and the property logic 126 operate in a similar manner as described above with respect to FIG. 1A. However, here the bottom electrode layer 114 suffers from dishing 202 and the memory element layer 116 suffers from dishing 204. Dishing may be caused during fabrication of the integrated chip structure 102. For example, during CMP, the removal rate of dielectric material is slower than the removal rate of metal material. Thus, layers of the integrated chip structure 102 may react differently to CMP and be deformed based on the material being removed.

If dishing is present, it will change a property of the integrated chip structure 102 that is measurable by the measurement device 124. For example, dishing will change a resistance of the integrated chip structure 102 measured by the measurement device 124. This is because when dishing occurs, it changes a thickness of the bottom electrode layer 114 and the memory element layer 116 to be larger than expected. The larger thickness causes a cross-sectional area of the bottom electrode layer 114 and the memory element layer 116 to increase, and an associated resistance between the monitor pads 122a/122b to decrease.

In some embodiments, the measurement device 124 can also determine if a dielectric layer 110 underlying bottom electrode layer 114 has been broken by a CMP process. This is because the broken dielectric layer 110 causes the bottom electrode layer 114 to extend to a plurality of metal layer structures 108 underlying the dielectric layer 110, and thereby increases a cross-sectional area of conductive metal along a lower surface of the bottom electrode layer 114. The increased cross-sectional area will result in a smaller resistance between the memory element layer 116 and the plurality of metal layer structures 108, which will thus decrease a resistance between the monitor pads 122a/122b (since the smaller resistance is in parallel to the resistance between monitor pads 122a/122b).

Figure 2B:
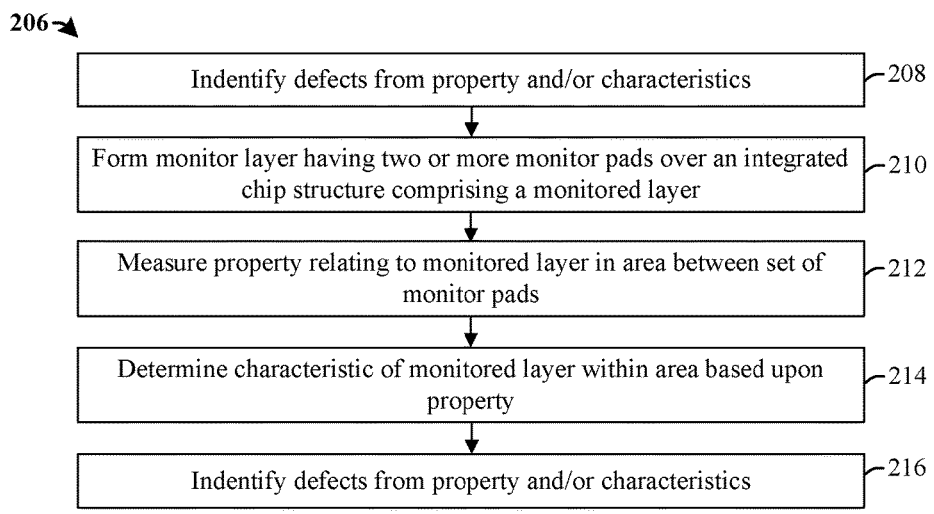
FIG. 2B illustrates a flow diagram of some embodiments of a method of determining a characteristic of an integrated chip structure.

FIG. 2B illustrates a flow diagram of some embodiments of a method 206 of determining a characteristic of an integrated chip structure. Although the method 206 is described in relation to the structure shown in FIG. 2A, it will be appreciated that the method is not limited to such a structure.

At 208, an integrated chip structure having a monitored layer is formed over a substrate.

At 210, a monitor layer having two or more monitor pads is formed over an integrated chip structure comprising a monitored layer.

At 212, a property relating to the monitored layer is measured in an area between a set of the monitor pads. In some embodiments, the measurement device 124 may measure a property, like the amount of resistance between the monitor pads 122a/122b.

At 214, a characteristic of the monitored layer within the area may be determined based upon the property, in some embodiments. For example, a resistance between the monitor pads 122a/122b is inversely proportional to a thickness of the monitored layer (e.g., the bottom electrode layer 114 and/or the memory element layer 116) since the resistivity of a material is inversely proportional to its a cross-sectional area. Therefore, in some embodiments, the property logic 126 can use the measured resistance to calculate the thickness of the monitored layer with a high degree of accuracy.

At 216, defects may be identified from the property and/or the characteristic, in some embodiments. In some embodiments, defects like the dishing 202 and 204 can be identified by the property logic 126. For example, if the property and/or the characteristic is within a first range, the monitored layer has an expected thickness and substantially no dishing is present in the underlying dielectric layer 110. Alternatively, if the property and/or the characteristic is within a second range the monitored layer has a thickness that is greater than expected. In such a case, dishing is present in the underlying dielectric layer 110 but is not sufficient to have through the dielectric layer 110. Alternatively, if the property and/or the characteristic is within a second range third range dishing is present and has broken through the dielectric layer 110.

Figure 3A:
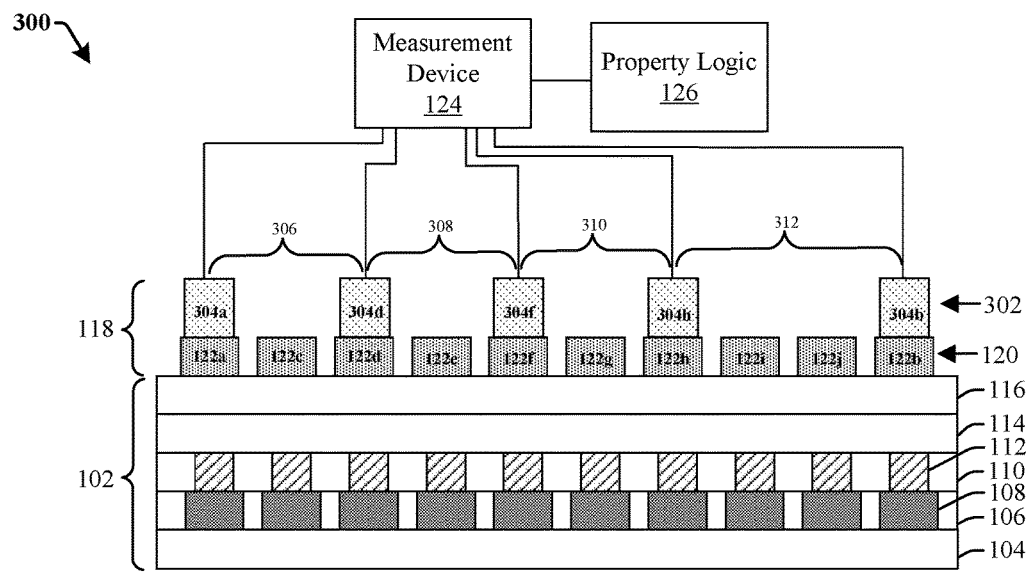
FIG. 3A illustrates a cross-sectional view of some other embodiments of a device for determining a characteristic of a monitored layer.

FIG. 3A illustrates a cross-sectional view of some other embodiments of an integrated chip 300 having an integrated chip structure 102 for determining a characteristic of a monitored layer. The integrated chip structure 102, the measurement device 124, and the property logic 126 operate in a similar manner as described above with respect to FIG. 1A. Here, the monitor structure 118 includes the monitor layer 120 and a contact pad layer 302. The monitor layer 120 includes the monitor pads 122a/122b, as well as monitor pads 122c, 122d, 122e, 122f, 122g, 122h, 122i, 122j. The contact pad layer 302 has contact pads that overlie at least some of the monitor pads. Here, the contact pads 304a, 304b, 304d, 304f, and 304h correspond to monitor pads 122a, 122b, 122d, 122f, and 122h, respectively.

In some embodiment, the monitor layer 120 with a predetermined number of monitor pads may be deposited over the integrated chip structure 102. Based on the desired information regarding characteristics of the integrated chip structure 102, contact pads of the contact pad layer 302 may be deposited over desired monitor pads. In some embodiments, the contact pads 304a, 304b, 304d, 304f, and 304h may be removable and repositionable. For example, the contact pads 304a, 304b, 304d, 304f, and 304h may be clamps or probes.

By selectively placing the contact pads 304a, 304b, 304d, 304f, and 304h over corresponding monitor pads 122a, 122b, 122d, 122f, and 122h properties of the integrated chip structure 102, and/or a monitored layer comprised therein, can be measured for specific locations between the monitor pads. For example, a first monitor pad distance 306 ranges from the monitor pad 122a to monitor pad 122d. A first resistance may be measured by the measurement device 124 through the corresponding contact pads 304a and 304d for the first monitor pad distance 306. A second monitor pad distance 308 ranges from the monitor pad 122d to monitor pad 122f. A second resistance may be measured by the measurement device 124 through the contact pads 304d and 304f for the second monitor pad distance 308. A third monitor pad distance 310 ranges from the monitor pad 122f to monitor pad 122h. A third resistance may be measured by the measurement device 124 through the contact pads 304f and 304h for the third monitor pad distance 310. The property logic 126 can determine a thickness profile of the memory element layer 116 by using the first resistance, second resistance, and third resistance, to calculate a corresponding first thickness, second thickness, and third thickness of the memory element layer 116. The first thickness corresponds a region of the memory element layer 116 underlying the first monitor pad distance 306, the second thickness corresponds to the second monitor pad distance 308, and the third thickness corresponds to the third monitor pad distance 312. The thicknesses can be combined to generate a thickness profile for at least a portion of the memory element layer 116 or other layers of the integrated chip structure 102. Therefore, fluctuations in thickness can be determined for the memory element layer 116 by taking a number of measurements.

While described for adjacent monitor pads 122a/122b and/or contact pads 304a/304b, larger regions may also be monitored. For example, a resistance may be measured between 304a and 304f corresponding to a region that combines the first monitor pad distance 306 and the second monitor pad distance 308.

Figure 3B:
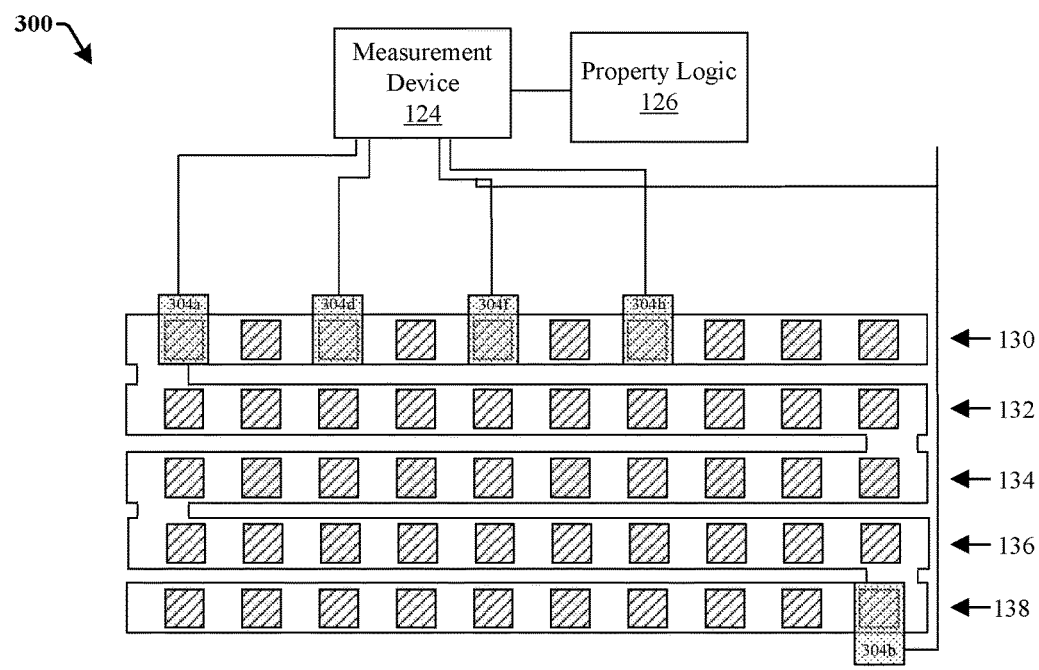
FIG. 3B illustrates a top view of a device for determining a characteristic of a monitored layer corresponding to the embodiment shown in FIG. 3A.

FIG. 3B illustrates a top view of the integrated chip 300 having a device for determining a characteristic of a monitored layer corresponding to the embodiment shown in FIG. 3A. Here the BEVAs 112 are shown relative to their position in the memory element layer 116 and the contact pads 304a, 304b, 304d, 304f, and 304h 304j. Accordingly, as shown, a contact pad, like contact pad 304a, can be placed to overlie a BEVA 112. In some embodiments, the contact pad 304a and corresponding monitor pad 122a are disposed over the memory element layer 116 but not a BEVA 112.

Furthermore, as discussed above with respect to FIG. 1B, the monitor pads 122a, 122b, 122d, 122f, 122h, and 122j may be spaced across multiple memory lines 130, 132, 134, 136, and 138. Likewise, the contact pads 304a, 304b, 304d, 304f, and 304j corresponding to the monitor pads 122a, 122b, 122d, 122f, 122h, and 122j may be disposed across the multiple memory lines 130, 132, 134, 136, and 138.

Figure 4:
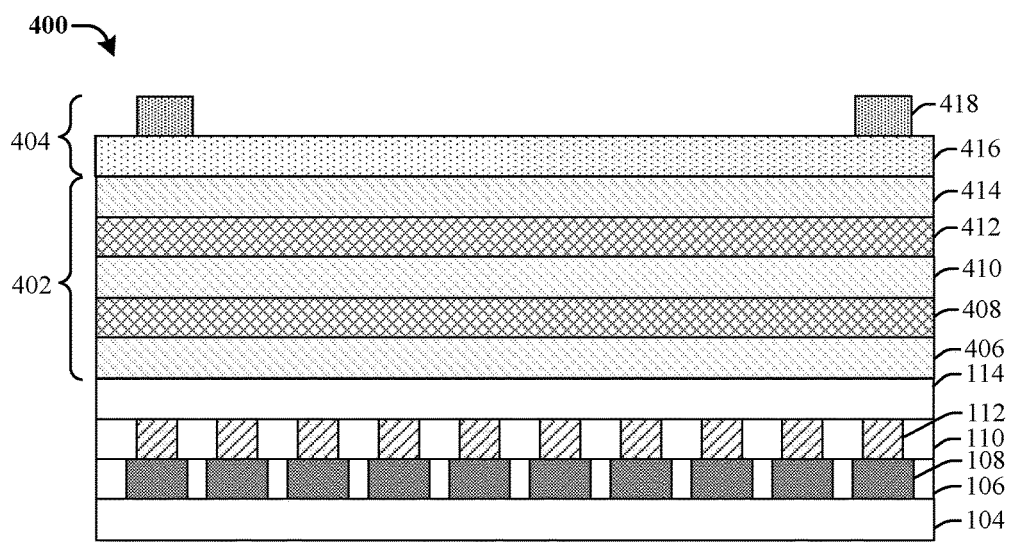
FIG. 4 illustrates a cross-sectional view of some embodiments of an integrated chip structure comprising a magnetic tunnel junction (MTJ).

FIG. 4 illustrates a cross-sectional view of some embodiments of an integrated chip structure comprising a magnetic tunnel junction (MTJ). The MTJ device 400 includes an integrated chip structure 402 arranged over a bottom electrode layer 114. The integrated chip structure 402 may include a first ferromagnetic layer 406, a first space layer 408, and second a ferromagnetic layer 410. In some embodiments, the integrated chip structure 402 may further comprise a second spacer layer 412 and/or a third ferromagnetic layer 414.

One or more of the ferromagnetic layers 406, 410, and/or 414 act as pinned layers while one or more remaining ferromagnetic layers 406, 410, and/or 414 act as free layers. For example, in some embodiments, the first and second ferromagnetic layers, 406 and 410, may act as the pinned layers, while the third ferromagnetic layer 414 acts as a free layer. In some such embodiments, a capping layer 416 may be arranged in contact with the third ferromagnetic layer 414. In other embodiments, the second and third ferromagnetic layers, 410 and 414, may act as the pinned layers, while the first ferromagnetic layer 406 acts as a free layer. In some such embodiments, a capping layer (not shown) may be arranged in contact with the first ferromagnetic layer 406.

A monitor structure 404 is arranged over the integrated chip structure 402. The monitor structure 404 comprises a monitor layer 418 arranged over the third ferromagnetic layer 414. In some embodiments, the monitor layer 418 may be arranged in contact with the capping layer 416. In other embodiments (not shown), the monitor layer 418 may be arranged in contact with third ferromagnetic layer 414. In some such embodiments, the capping layer 416 may be used as a monitor layer 418. In such embodiments, the capping layer 416 may comprise discrete segments arranged over the third ferromagnetic layer 414, which continuously extends below the discrete segments. The discrete segments may be used for monitoring and subsequently as a capping layer for individual memory cells of an MRAM array. In such embodiments, the monitor layer 418 may not be present. The monitor layer 418 operates in a similar manner as the monitor layer 120 described above with respect to FIG. 1A.

FIGS. 5-14 illustrate cross-sectional views of some embodiments showing a method of manufacturing a device for determining a characteristic of An integrated chip layer.

Figure 5:
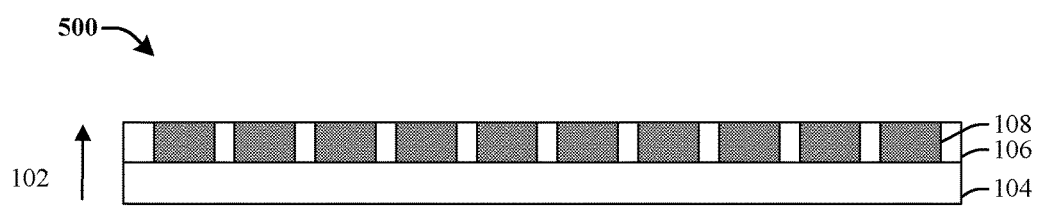
FIGS. 5-14 illustrate cross-sectional views of some embodiments showing a method of manufacturing a device for determining a characteristic of a monitored layer.

As shown in cross-sectional view 500 of FIG. 5, an inter-layer dielectric (ILD) layer 106 is formed over a substrate 104. The ILD layer 106 surrounds a plurality of metal layer structures 108. In some embodiments, the plurality of metal layer structures 108 are formed by forming the ILD layer 106 (e.g., an oxide, a low-k dielectric, or an ultra low-k dielectric) over the substrate 104, followed by a damascene process to form openings within the ILD layer 106 and filling a metal material (e.g., copper, aluminum, etc.) into the openings. A planarization process can be then performed to remove excess metal material to form the plurality of metal layer structures 108. In some embodiments, the metal lines are separated by approximately 10 Å to 0.5 μm.

Figure 6A:
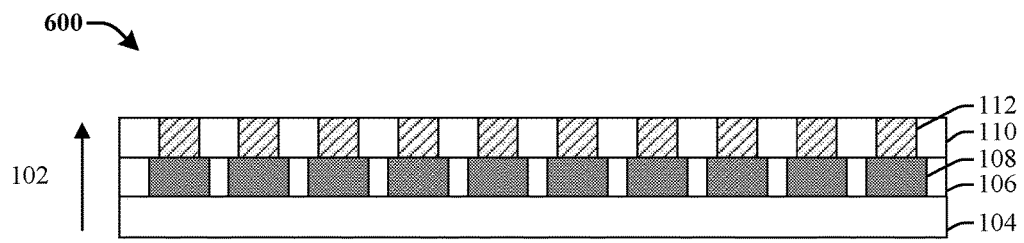

As shown in cross-sectional view 600 of FIG. 6A, a dielectric layer 110 is formed over the ILD layer 106. In some embodiments, the dielectric layer 110 may comprise silicon-nitride (SiN), silicon-carbide (SiC), or a similar composite dielectric film. The dielectric layer 110 may be formed by one or more deposition processes (e.g., physical vapor deposition, chemical vapor deposition, etc.). The dielectric layer 110 includes a plurality of bottom electrode vias (BEVAs) 112. In some embodiments, the plurality of BEVAs 112 are formed using a similar damascene process, as described above, which forms openings within the dielectric layer 110 and then fills the openings with a metal material (e.g., titanium nitride, tantalum nitride, etc.). A planarization process can be then performed to remove excess metal material to form the plurality of BEVAs 112.

Figure 6B:
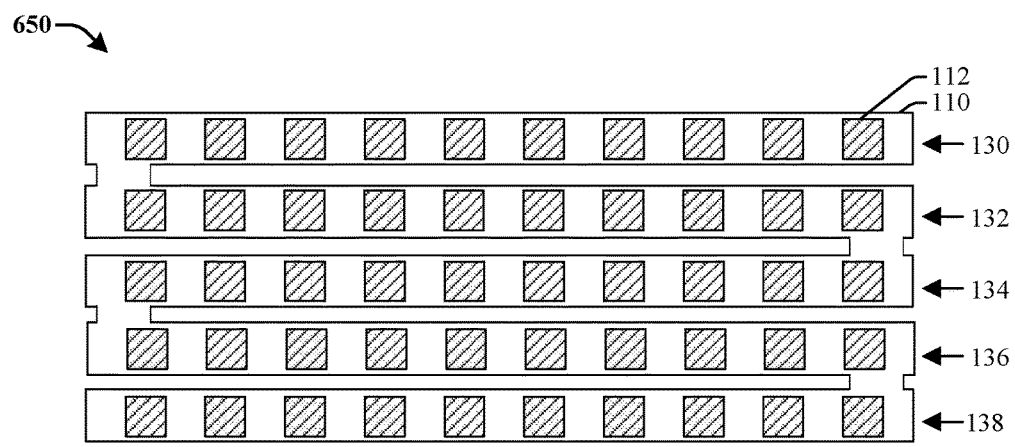

FIG. 6B illustrates a top view 650 corresponding to the embodiment shown in FIG. 6A. As discussed above, the integrated chip structure 102 may include a plurality of memory lines 130, 132, 134, 136, and 138. The BEVAs 112 are distinctly arranged in the dielectric layer 110. For example, individual BEVAs 112 may be separated by approximately twice the distance of the separation of the metal layer structures 108.

Figure 7:
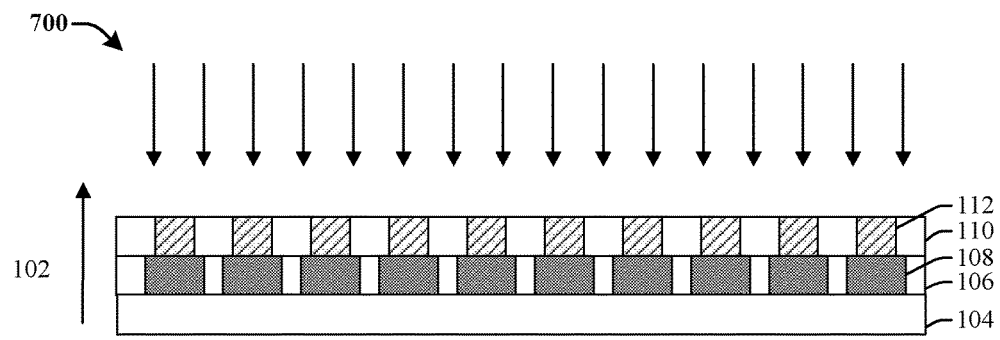

As shown in cross-sectional view 700 of FIG. 7, the dielectric layer 110 is planarized to remove excess conductive material, resulting in a planarized dielectric layer 110 having a planar upper surface. In some embodiments, the planarization may be performed using a chemical mechanical planarization (CMP) process, which can cause defects in the surface and underlying layers. In some embodiments, the defects may comprise dishing.

Figure 8A:
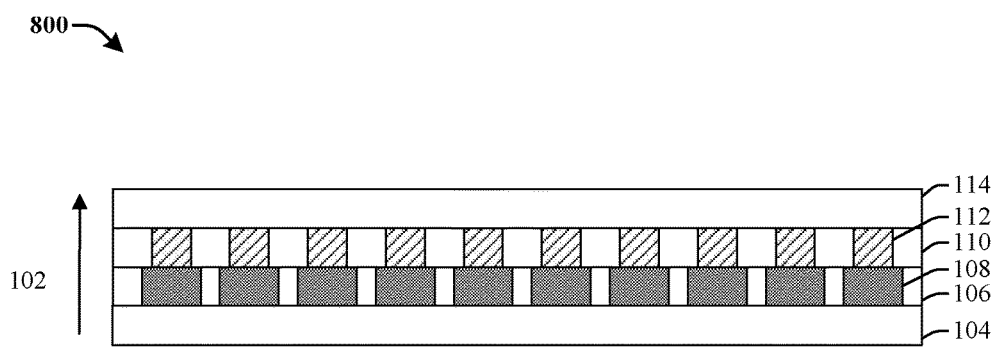

As shown in cross-sectional view 800 of FIG. 8A, a bottom electrode layer 114 is formed over the dielectric layer 110. In some embodiments, the bottom electrode layer 114 may be deposited by way of a single, continuous deposition process. In other embodiments, the bottom electrode layer 114 may be deposited by way of a plurality of deposition processes performed in-situ (i.e., without breaking a vacuum of a deposition chamber in which the deposition processes are performed). In some embodiments, the bottom electrode layer 114 is comprised of a conductive material, such as, titanium nitride (TiN) or tantalum nitride (TaN), a metal (e.g., titanium (Ti) or tantalum (Ta) copper), etc.

Figure 8B:
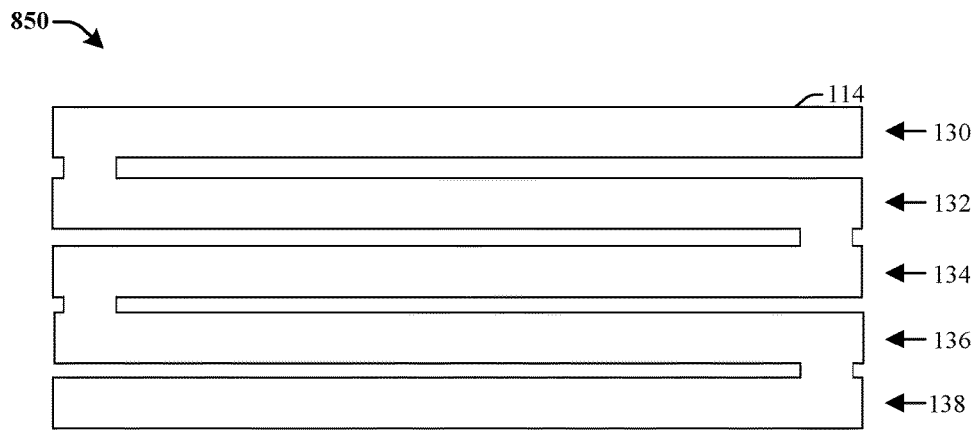

FIG. 8B illustrates a top view 850 corresponding to the embodiment shown in FIG. 8A. As discussed above, the integrated chip structure 102 may include a plurality of memory lines 130, 132, 134, 136, and 138. Here the bottom electrode layer 114 overlies the BEVAs 112 arranged in the dielectric layer 110.

Figure 9:
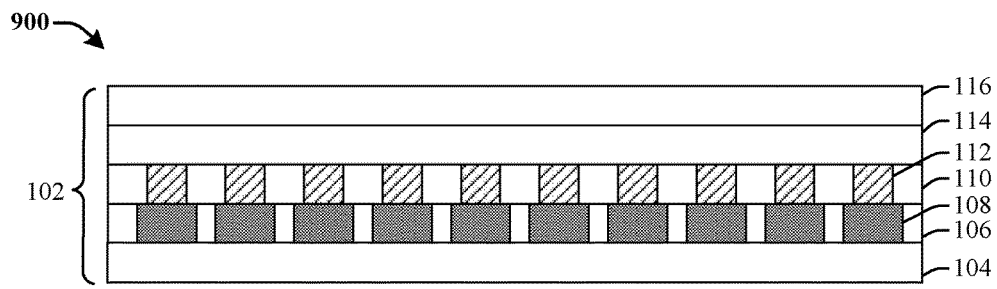

As shown in cross-sectional view 900 of FIG. 9, a memory element layer 116 is deposited over the bottom electrode layer 114. In some embodiments, the memory element layer 116 may comprise a magnetic tunnel junction (MTJ) structure having a pinned layer and a free layer, which are vertically separated by a spacer layer. In some embodiments, the pinned magnetic layer may comprise cobalt (Co), iron (Fe), boron (B), and/or ruthenium (Ru), the spacer layer may comprise magnesium oxide (MgO) and/or aluminum oxide ($Al_2O_3$), and the free magnetic layer may comprise combination of cobalt (Co), iron (Fe), and boron (B). In some embodiments, a capping layer may be formed over a top pinned layer. The capping layer may comprise a non-ferromagnet metal, such as silver (Ag), gold (Au), copper (Cu), tantalum (Ta), tungsten (W), manganese (Mn), platinum (Pt), palladium (Pd), or a similar material.

Figure 10A:
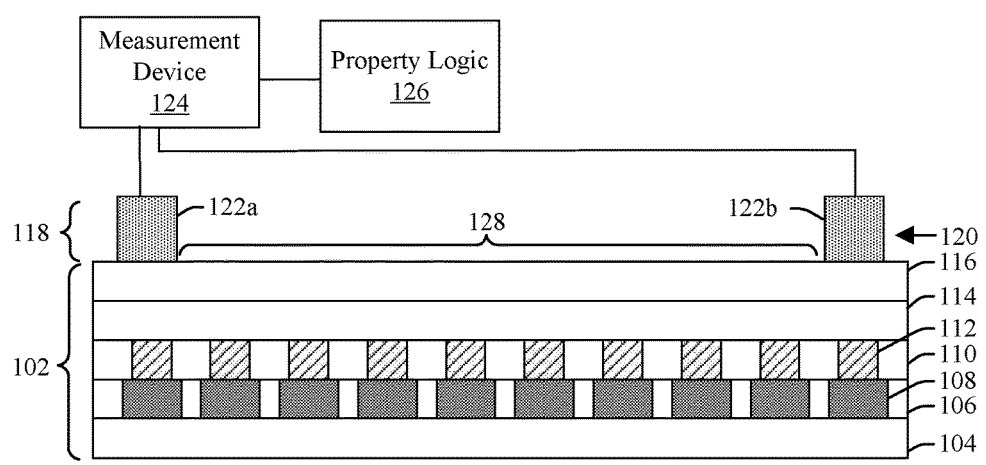

As shown in cross-sectional view 1000 of FIG. 10A, a monitor layer 120 is formed over the memory element layer 116. The monitor layer 120 may be deposited by way of a single, continuous deposition process. In other embodiments, the bottom electrode layer 114 may be deposited by way of a plurality of deposition processes performed in-situ. The monitor layer 120 may then be patterned to form the plurality of monitor pads 122a/122b. In some embodiments, the patterning process can comprise a dry etching process that may have an etchant chemistry including $CF_4$, $CH_2F_2$, $Cl_2$, $BCl_3$ and/or other chemicals. Alternatively or additionally, the patterning process may comprise a wet etching process. The monitor pads 122a/122b can be used in the manner described above to measure electrical properties of the layers of the integrated chip structure 102. In particular, a property may be measured between two monitor pads 122a/122b of the plurality of monitor pads. The two monitor pads are separated by a monitor pad distance 128.

In some embodiments, wherein the memory element layer 116 is a MTJ structure of an MRAM memory cell, the monitor layer may comprise a capping layer. In such embodiments, the capping layer may be patterned to form the monitor pads 122a/122b, which subsequently are the individual capping layers of MRAM cells. For example, a first monitor pad 122a would be a capping layer of a first MRAM cell and a second monitor pad 122b, which is separated from the first monitor pad 122a by a lateral space, would be a capping layer of a second MRAM cell. Therefore, the capping layer is used as both a monitor layer and a capping layer, thereby eliminating the need for an additional processing step to deposit a monitor layer.

In some embodiments, the monitor pads 122a/122b are electrically connected to the measurement device 124 and the property logic 126 to determine a characteristic of the integrated chip structure 102. The measurement device 124 may be used to measure an electrical property between the monitor pads 122a/122. Then, the property logic 126 can determine a characteristic of at least a region underlying integrated chip structure 102.

Figure 10B:
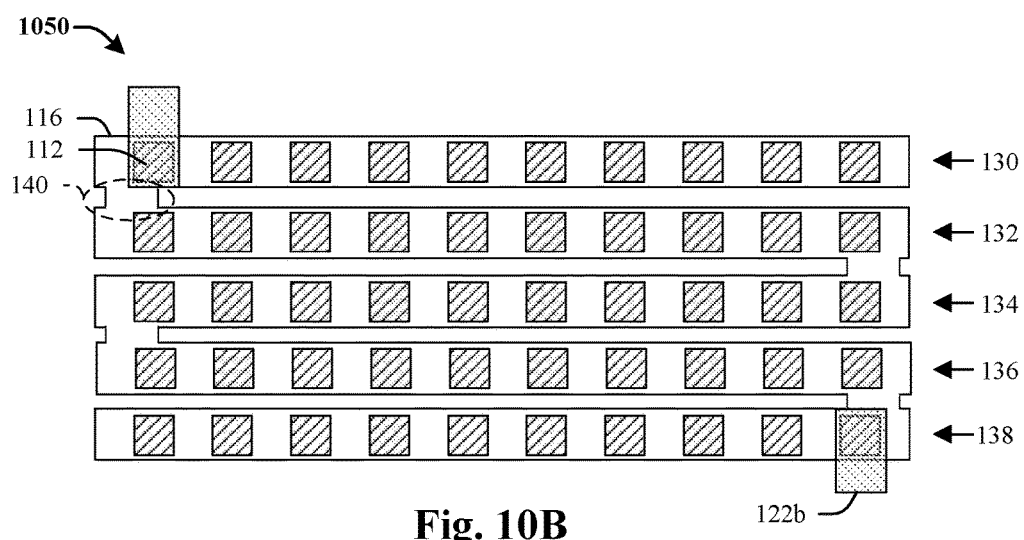

FIG. 10B illustrates a top view 1050 corresponding to the embodiment shown in FIG. 10A. As discussed above, the integrated chip structure 102 may include a plurality of memory lines 130, 132, 134, 136, and 138. Here, the monitor pads 122a/122b overlie the BEVAs 112.

In some embodiments, after the monitoring is performed further processing steps may be performed to form a memory array. One example of such an embodiment is shown in FIGS. 11-14. In other embodiments, the monitoring layer may remain on an integrated chip after monitoring has been completed (e.g., in an area of an integrated chip that is peripheral to a memory array and/or logic devices).

Figure 11:
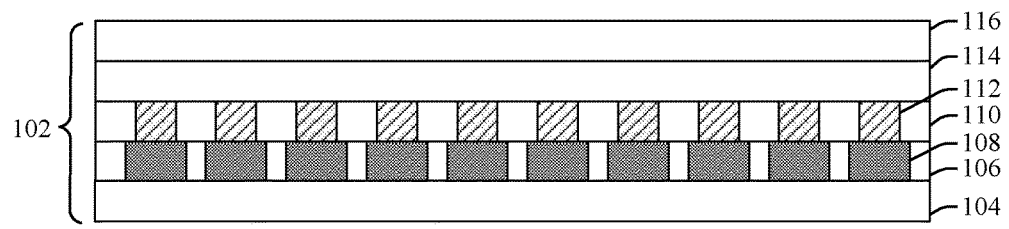

As shown in cross-sectional view 1100 of FIG. 11, after the monitoring is performed and the characteristics of underlying layers are determined, the monitor layer 120 is removed leaving the memory element layer 116 as the uppermost layer of the integrated chip structure 102. In some embodiments, wherein the monitor layer 120 is a capping layer over a MTJ structure, this act may be skipped and the monitor layer may be kept in place as a capping layer.

Figure 12:
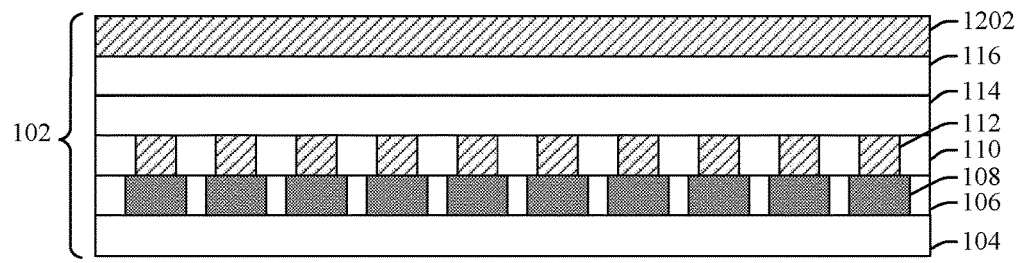

As shown in cross-sectional view 1200 of FIG. 12, one or more top electrode layers 1202 are formed over the memory element layer 116. The one or more top electrode layers 1202 may comprise one or more conductive layers. The one or more conductive layers may comprise titanium nitride (TiN) or tantalum nitride (TaN), a metal (e.g., titanium (Ti) or tantalum (Ta) copper) etc.

Figure 13A:
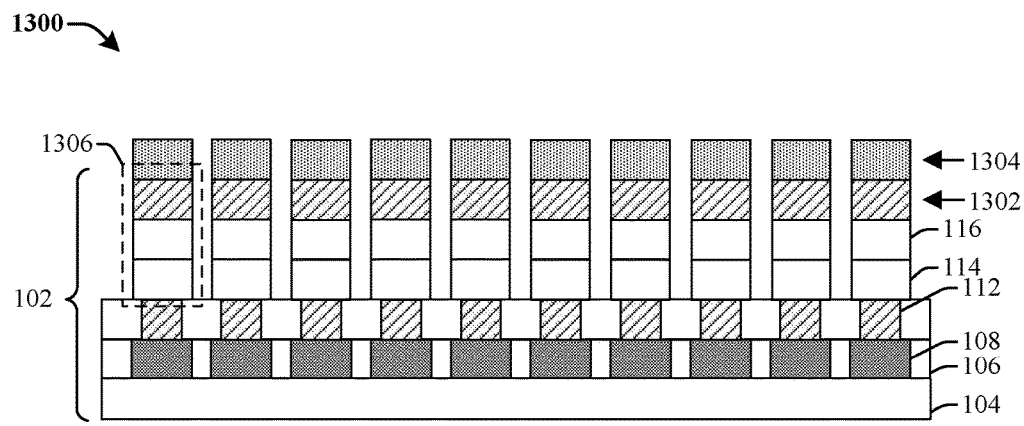

As shown in cross-sectional view 1300 of FIG. 13A, the one or more top electrode layers (1202 of FIG. 12) and the integrated chip structure 102 are patterned to form a plurality of memory cells 1306. Patterning the one or more top electrode layers form a plurality top electrodes 1302 over of the memory element layer 116. The patterning further removes areas of the dielectric layer 110, the planarized bottom electrode layer 114, and the memory element layer 116 that do not underlie the plurality of top electrodes 1302. As shown, the one or more top electrode layers 1202 are patterned such that the plurality of top electrodes 1302 overlie the BEVAs 112. In some embodiments, the patterning process can comprise a dry etching process that may have an etchant chemistry including $CF_4$, $CH_2F_2$, $Cl_2$, $BCl_3$ and/or other chemicals.

Figure 13B:
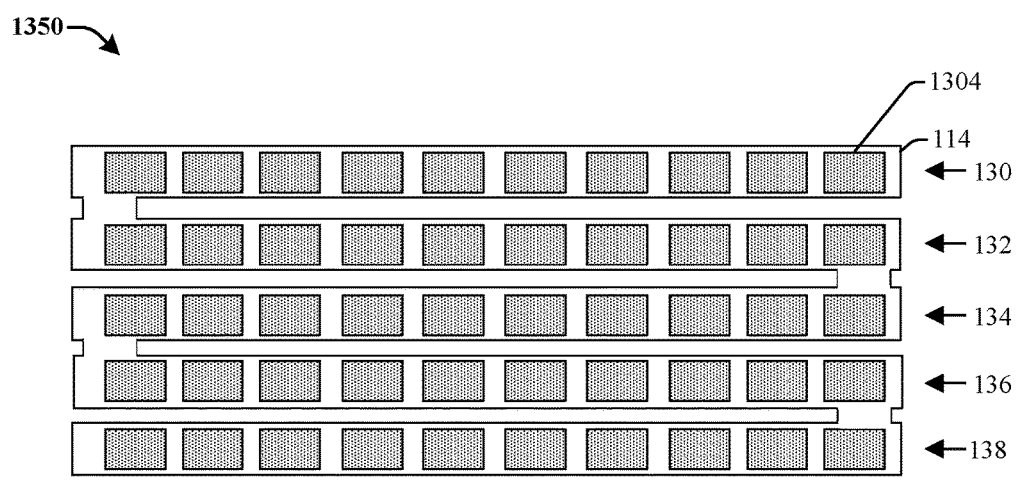

FIG. 13B illustrates a top view 1350 corresponding to the embodiment shown in FIG. 13A. As shown, the plurality of top electrodes 1302 are arranged over the memory element layer 116.

Figure 14:
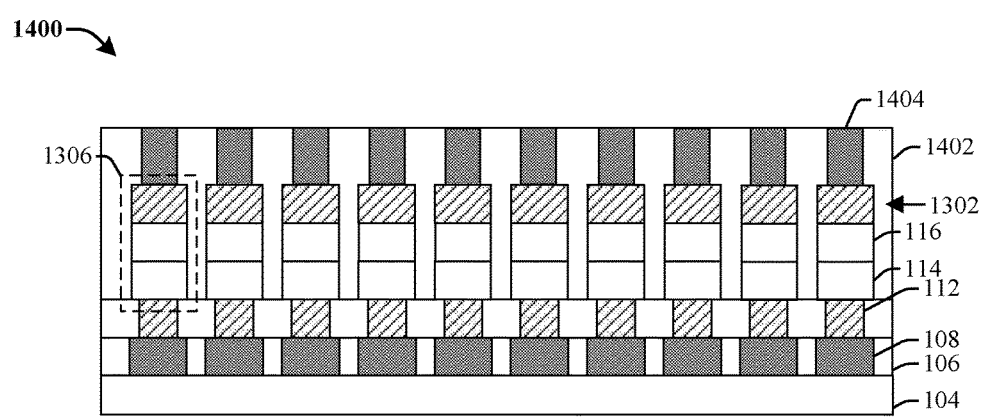

As shown in cross-sectional view 1400 of FIG. 14, an upper dielectric layer 1402 is formed over the plurality of memory cells 1306. The upper dielectric layer 1402 may comprise an oxide or a low-k dielectric layer. In some embodiments, a plurality of metal via 1404 may be formed to extend through the upper dielectric layer 1402 to contact the plurality of top electrodes 1302 of the plurality of memory cells 1306.

Figure 15:
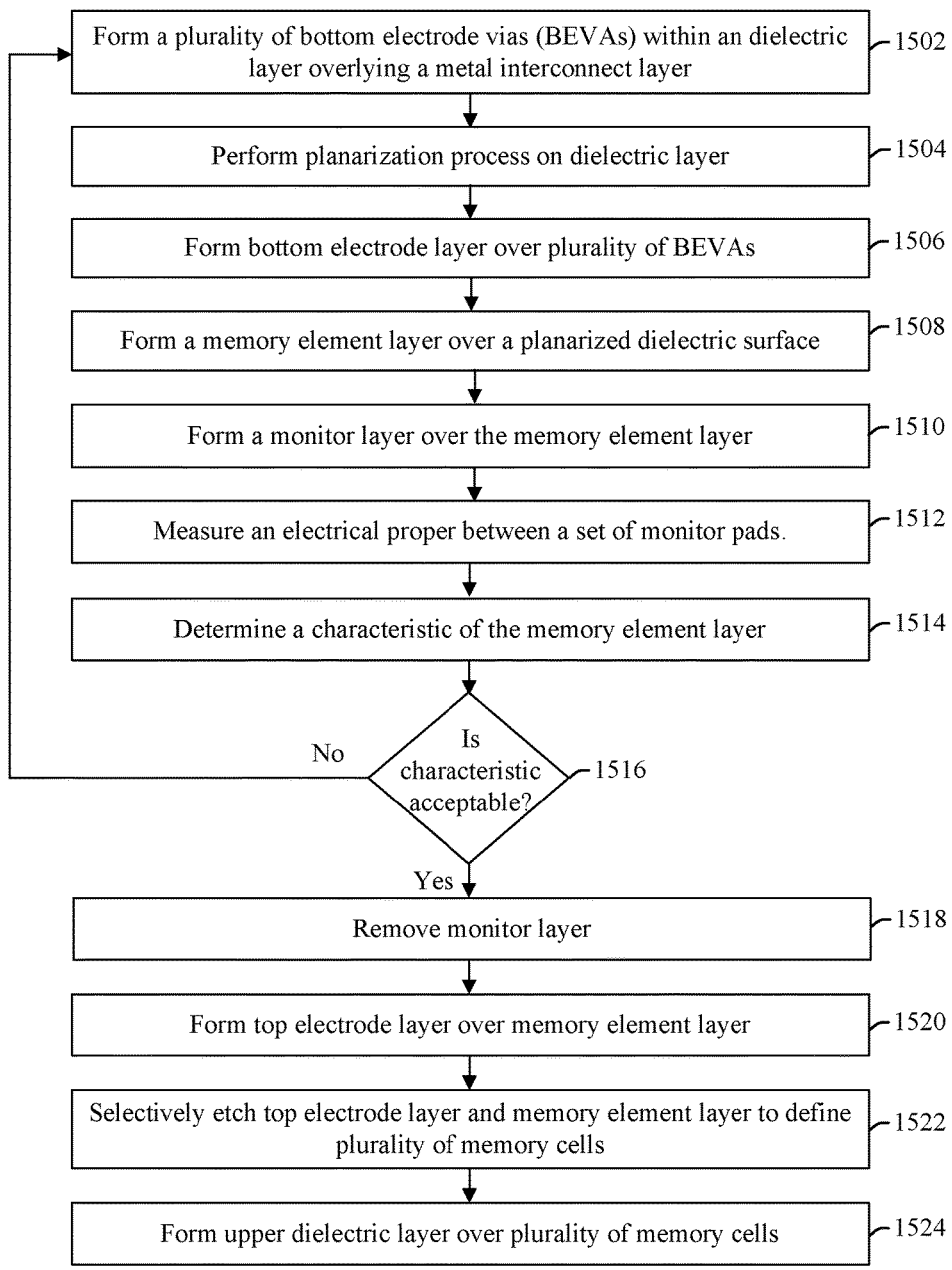
FIG. 15 illustrates a flow diagram of some embodiments of a method of determining a characteristic of a monitored layer.

FIG. 15 shows some embodiments of a flow diagram of a method 1500 of determining a characteristic of an integrated chip layer. Although method 1500 is described in relation to FIGS. 5-14, it will be appreciated that the method 1500 is not limited to such structures disclosed in FIGS. 5-14, but instead may stand alone independent of the structures disclosed in FIGS. 5-14. Similarly, it will be appreciated that the structures disclosed in FIGS. 5-14 are not limited to the method 1500, but instead may stand alone as structures independent of the method 1500. Also, while disclosed methods (e.g., method 1500) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1502, a plurality of bottom electrode vias are formed within a dielectric layer overlying a metal interconnect layer having a plurality of metal layer structures. FIGS. 5, 6A, and 6B illustrate some embodiments of views 500, 600, 650, corresponding to act 1502.

At 1504, a planarization process is performed on the dielectric layer. The planarization process may comprise a chemical mechanical planarization (CMP) process. FIG. 7 illustrates some embodiments of a cross-sectional view 700 corresponding to act 1504.

At 1504, a bottom electrode layer is formed over the plurality of bottom electrode vias. FIGS. 8A-8B illustrate some embodiments of views 800 and 850 corresponding to act 1506.

At 1508, a memory element layer is formed over a planarized dielectric surface. FIG. 9 illustrates some embodiments of a cross-sectional view 900 corresponding to act 1508.

At 1510, a monitor layer is formed over the memory element layer. The monitor layer includes a plurality of monitor pads arranged into a plurality of sets of monitor pads. FIGS. 10A and 10B illustrates some embodiments of views 1000 and 1050 corresponding to act 1510.

At 1512, an electrical property may be measured between a set of the monitor pads that are separated by a monitor pad distance. FIGS. 10A and 10B illustrates some embodiments of views 1000 and 1050 corresponding to act 1512.

At 1514, a characteristic of a region of the memory element layer underlying the monitor pad distance is determined. FIGS. 10A and 10B illustrates some embodiments of views 1000 and 1050 corresponding to act 1514.

At 1516, the characteristic may be compared to a threshold value to determine if a physical structure of the memory element layer is acceptable. For example, the characteristic may be compared to a threshold to determine if unacceptable dishing has occurred during the planarization process. If the characteristic is acceptable (i.e., the characteristic does not violate the threshold) the method proceeds to act 1516. If the characteristic is not acceptable (i.e., the characteristic violates the threshold) corrective action may be taken. In some embodiments, the corrective action may be to remove the memory layer, the bottom electrode layer, the BEVA and ILD layers and the method may return to act 1602. In other embodiments, the corrective action may be to discard the die. In yet other embodiments, the corrective action may be removal of regions having unacceptable characteristics.

At 1518, the monitor layer may be removed, in some embodiments. FIG. 11 illustrates some embodiments of a cross-sectional view 1100 corresponding to act 1518. In some embodiments, wherein the monitor layer is a capping layer over a MTJ structure, this act may be skipped and the monitor layer may be kept in place as a capping layer.

At 1520, a top electrode layer may be formed over the memory element layer. FIG. 12 illustrates some embodiments of a cross-sectional view 1200 corresponding to act 1520.

At 1522, the top electrode layer and memory element layer are selectively etched to define plurality of memory cells. FIG. 13 illustrates some embodiments of views 1300 and 1350 corresponding to act 1522.

At 1524, an upper dielectric layer is formed over the plurality of memory cells. FIG. 14 illustrates some embodiments of a cross-sectional view 1400 corresponding to act 1524.

It will be appreciated that while reference is made throughout this document to exemplary structures in discussing aspects of methodologies described herein that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

It will be appreciated that while reference is made throughout this document to exemplary structures in discussing aspects of methodologies described herein that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes such modifications and alterations and is generally not intended to be limited thereby. For example, although the figures provided herein are illustrated and described to have a particular doping type, it will be appreciated that alternative doping types may be utilized as will be appreciated by one of ordinary skill in the art.

In some embodiments, the present disclosure relates to a method of manufacturing an integrated circuit (IC). The method comprises forming an integrated chip structure over a substrate. The method further includes forming a monitor layer over the integrated chip structure. The monitor layer includes a plurality of monitor pads. The method also includes measuring an electrical property between a set of monitor pads of the plurality of monitor pads. The set of monitor pads are laterally spaced apart by a monitor pad distance. A characteristic of a region of the integrated chip structure underlying the monitor pad distance between the set of monitor pads is determined based on the measured electrical property.

In another embodiment, the present disclosure relates to a method of manufacturing an integrated circuit (IC). The method comprises forming a plurality of metal layer structures within an inter-layer dielectric (ILD) layer over a substrate. The method further includes forming a dielectric layer over the ILD layer. At least one bottom electrode via (BEVA) is disposed within the dielectric layer. A chemical mechanical planarization (CMP) process is performed on the dielectric layer. A bottom electrode layer is formed over the dielectric layer. The method further includes forming a memory element layer over the bottom electrode layer. Then a monitor layer is formed over the memory element layer. The monitor layer includes a plurality of monitor pads. An electrical property is measured between a set of monitor pads. The monitor pads of the set of monitor pads are laterally separated by a monitor pad distance. A thickness of the memory element layer directly underlying the monitor pad distance is determined based on the measured electrical property.

In yet another embodiment, the present disclosure relates to a method of manufacturing an integrated circuit (IC). The method comprises forming a monitor layer over an integrated chip structure including a plurality of layers. The monitor layer includes a first monitor pad and a second monitor pad. A resistance is measured between the first monitor pad and the second monitor pad. The first monitor pad and the second monitor pad are laterally spaced apart a monitor pad distance. A thickness of a layer of the plurality of layers of the integrated chip structure underlying the monitor pad distance between the first monitor pad and the second monitor pad based, at least in part, on the measured resistance.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising
    forming an integrated chip structure over a substrate;
    forming a monitor layer over the integrated chip structure, wherein the monitor layer includes a plurality of monitor pads;

measuring an electrical property between a set of monitor pads of the plurality of monitor pads, wherein the set of monitor pads are laterally spaced apart by a monitor pad distance;

determining a characteristic of a region of the integrated chip structure underlying the monitor pad distance between the set of monitor pads based, at least in part, on the measured electrical property;

forming a top electrode layer over a memory element layer within the integrated chip;

selectively etching the top electrode layer and memory element layer to define a plurality of memory cells; and forming an upper dielectric layer over the plurality of memory cells.

2. The method of claim 1, wherein the electrical property is resistance.

3. The method of claim 2, wherein the characteristic is a thickness of one or more layers within the integrated chip structure, and wherein the resistance is inversely proportional to the thickness of the one or more layers.

4. The method of claim 1, wherein forming the integrated chip structure comprises:

forming a dielectric layer over the substrate; and forming a conductive layer over the dielectric layer, wherein the dielectric layer and the conductive layer are comprised within the integrated chip structure.

5. The method of claim 4, further comprising:

performing a chemical mechanical polishing process on the dielectric layer prior to forming the conductive layer.

6. The method of claim 1, wherein the monitor layer has a first outermost monitor layer sidewall and a second outermost monitor layer sidewall, and wherein a monitor layer distance between the first outermost monitor layer sidewall and the second outermost monitor layer sidewall is about 4 to 10 micrometers.

7. The method of claim 1, wherein the integrated chip structure is a magnetic tunnel junction (MTJ) structure having layers arranged between a ferromagnetic layer and a capping layer, and wherein forming the monitor layer comprises forming the monitor layer over the capping layer.

8. The method of claim 1, wherein the monitor layer comprises a capping layer of a MTJ structure; and wherein the MTJ structure continuously extends below discrete segments of the capping layer when measuring the electrical property between the set of monitor pads.

9. A method, comprising:

forming a plurality of metal layer structures within an inter-layer dielectric (ILD) layer over a substrate;

forming a dielectric layer over the ILD layer, wherein at least one bottom electrode via (BEVA) is disposed within the dielectric layer;

performing a chemical mechanical planarization (CMP) process on the dielectric layer;

forming a bottom electrode layer over the dielectric layer;

forming a memory element layer over the bottom electrode layer;

forming a monitor layer over the memory element layer, the monitor layer having a plurality of monitor pads;

measuring an electrical property between a set of monitor pads, wherein monitor pads of the set of monitor pads are laterally separated by a monitor pad distance; and determining a thickness of the memory element layer directly underlying the monitor pad distance based on the measured electrical property.

10. The method of claim 9, wherein the electrical property is resistance.

11. The method of claim 10, wherein the resistance is inversely proportional to the thickness of the memory element layer.

12. The method of claim 10, wherein the memory element layer is a magnetic tunnel junction (MTJ) structure having layers arranged between a ferromagnetic layer and a capping layer, and wherein the monitor layer is formed over the capping layer.

13. The method of claim 9, wherein the monitor layer has a first outermost monitor layer sidewall and a second outermost monitor layer sidewall, and wherein a monitor layer distance between the first outermost monitor layer sidewall and the second outermost monitor layer sidewall is about 4 to 10 micrometers.

14. The method of claim 9, wherein the monitor pad distance is about 10 micrometers to 0.5 micrometers.

15. The method of claim 9, wherein the monitor layer is comprised of a conductive material.

16. A method, comprising forming a monitor layer over an integrated chip structure including a plurality of layers, wherein the monitor layer has a first monitor pad and a second monitor pad;

measuring resistance between the first monitor pad and the second monitor pad, wherein the first monitor pad and the second monitor pad are laterally spaced apart by a monitor pad distance; and determining that a layer of the plurality of layers underlying the monitor pad distance has dishing based on the measured resistance.

17. The method of claim 16, wherein the first monitor pad and the second monitor pad are comprised of a conductive material.

18. The method of claim 16, further comprising:

determining a thickness of the layer of the plurality of layers underlying the monitor pad distance between the first monitor pad and the second monitor pad based, at least in part, on the measured resistance.

19. The method of claim 18, wherein the measured resistance is inversely proportional to the thickness of the layer of the plurality of layers underlying the monitor pad distance.

20. The method of claim 16, wherein the integrated chip structure is a magnetic tunnel junction (MTJ) structure having layers arranged between a ferromagnetic layer and a capping layer, and wherein forming the monitor layer comprises forming the monitor layer over the capping layer.

* * * * *